United States Patent
Archer, III et al.

(10) Patent No.: US 7,429,502 B2
(45) Date of Patent: Sep. 30, 2008

(54) INTEGRATED CIRCUIT DEVICE INCORPORATING METALLURGICAL BOND TO ENHANCE THERMAL CONDUCTION TO A HEAT SINK

(75) Inventors: Vance D. Archer, III, Greensboro, NC (US); Kouros Azimi, Center Valley, PA (US); Daniel Patrick Chesire, Winter Garden, FL (US); Warren K Gladden, Macungie, PA (US); Seung H. Kang, Sinking Spring, PA (US); Taeho Kook, Orlando, FL (US); Sailesh M. Merchant, Macungie, PA (US); Vivian Ryan, Hampton, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 11/868,624

(22) Filed: Oct. 8, 2007

(65) Prior Publication Data
US 2008/0026508 A1   Jan. 31, 2008

Related U.S. Application Data

(62) Division of application No. 11/235,920, filed on Sep. 27, 2005.

(51) Int. Cl.
*H01L 21/00* (2006.01)
(52) U.S. Cl. .............................. 438/122; 257/E23.101; 257/719; 257/720; 257/E23.106

(58) Field of Classification Search ................. 438/122; 257/E23.101
See application file for complete search history.

(56) References Cited

U.S. PATENT DOCUMENTS

| 6,451,448 | B1* | 9/2002 | Kanda et al. ............... 428/612 |
| 7,023,089 | B1* | 4/2006 | Lu ............................. 257/751 |
| 2002/0105070 | A1 | 8/2002 | Shibamoto et al. |
| 2002/0167093 | A1 | 11/2002 | Koike |
| 2003/0071347 | A1 | 4/2003 | Wang et al. |
| 2004/0227229 | A1 | 11/2004 | Hu et al. |
| 2005/0121778 | A1 | 6/2005 | Liu et al. |

FOREIGN PATENT DOCUMENTS

| EP | 0865082 A1 | 9/1998 |
| EP | 1450402 A1 | 8/2004 |

* cited by examiner

*Primary Examiner*—Tu-Tu V Ho

(57) ABSTRACT

An integrated circuit device incorporating a metallurgical bond to enhance thermal conduction to a heat sink. In a semiconductor device, a surface of an integrated circuit die is metallurgically bonded to a surface of a heat sink. In an exemplary method of manufacturing the device, the upper surface of a package substrate includes an inner region and a peripheral region. The integrated circuit die is positioned over the substrate surface and a first surface of the integrated circuit die is placed in contact with the package substrate. A metallic layer is formed on a second opposing surface of the integrated circuit die. A preform is positioned on the metallic layer and a heat sink is positioned over the preform. A joint layer is formed with the preform, metallurgically bonding the heat sink to the second surface of the integrated circuit die.

10 Claims, 8 Drawing Sheets

INTEGRATED CIRCUIT DEVICE INCORPORATING METALLURGICAL BOND TO ENHANCE THERMAL CONDUCTION TO A HEAT SINK

RELATED APPLICATIONS

This application is a divisional of U.S. Ser. No. 11/235,920 filed Sep. 27, 2005, which is incorporated herein in its entirety by reference.

FIELD OF THE INVENTION

The present invention relates generally to semiconductor integrated circuits. More specifically, the invention relates to the structures and associated methods for transferring heat from an integrated circuit device.

BACKGROUND OF THE INVENTION

It is now commonplace to use flip chip methods to electrically connect a semiconductor die through a package substrate to a wiring board. These methods are particularly suitable for devices that contain a large number of bond pads, as an alternative to conventional wire bonding. The package substrate functions as an interface to a printed circuit or wiring board, in an arrangement commonly known as a FCBGA, or Flip Chip Ball Grid Array. In these assemblies, a heat sink is used to dissipate heat generated during device operation wherein a thermal grease is often applied as an interface between the back side of the die and the heat sink. However, thermal conductivity between the back side of the die and the heat sink is often less than desired for optimal heat dissipation. This is, in part, because the surface of the heat sink placed against the die is not perfectly smooth. The back side surface of the semiconductor device may also have smoothness variations. As a result, air is often trapped between these two surfaces, making heat transfer from the device to the heat sink less efficient.

Several techniques to smoothen these rough surfaces have been proposed. These include applying pressure to the mating surfaces. Other techniques of eliminating gaps include filling them with materials of high thermal conductivity such as a thermal grease, using elastomeric pads, conductive adhesives, phase-change materials, mica pads, adhesive tapes and polyamide films.

A typical thermal grease comprises a composite of silicone or hydrocarbon oil with a thermally conductive material such as aluminum oxide, another oxide powder, or other suitable conductive filler materials. Particle size of the conductive material is critical in determining thermal conductivity of the film. Moreover, interposing a layer of thermal grease can be difficult from a manufacturing standpoint, e.g., such greases tend to evaporate, extrude and flow over short time periods, and, because these thermal greases are not adhesive, a mechanical attachment technique must be employed to apply sufficient pressure at the heat sink/device interface and minimize bond layer thickness. Often, such adhesion is provided by external sink pads and adhesive layers with the die "loosely" coupled to the heat sink. Care in the application of silicone-based greases is required as they can contaminate the solder areas.

Elastomers are easier to apply than thermal greases, but require higher mechanical pressure to inject the material to fill the voids. Some elastomeric materials are pre-formed. These elastomeric fillers consist of silicone-rubber pads containing a matrix of high thermal conductivity material such as boron nitride. Application of necessary pressure can create such excessive stress that leads and solder joints can fracture. The external stresses can also affect the chip inside the package.

Porosity is also an undesirable characteristic of thermoset compounds, making conductive heat transfer inefficient. Moreover, differences in thermal expansion between such compounds, the heat sink and silicon, can create reliability issues.

Elastomers and thermal greases are also known to exhibit phase changes when devices are exposed to wide temperature and humidity conditions, rendering them unsuitable for applications in computer systems, automobiles and mobile communications devices.

SUMMARY OF THE INVENTION

In accordance with the invention, a semiconductor device includes an integrated circuit die having first and second surfaces. The first surface is configured for electrical connection between elements formed thereon and a plurality of solder bump package conductors. A heat sink has a surface metallurgically bonded to the second surface of the integrated circuit die.

In an associated method, a package substrate has upper and lower surfaces, and the upper surface includes an inner region and a peripheral region. An integrated circuit die is positioned over the substrate upper surface. The die includes a first surface in contact with the package substrate and a second opposing surface having a metallic layer formed thereon. A preform is positioned on the metallic layer and a heat sink is positioned over the preform. A joint layer is formed with the preform, metallurgically bonding the heat sink to the second surface of the integrated circuit die.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

While the invention is now described in the context of packaging a semiconductor die using flip chip methods, it should be recognized that this is only exemplary of structures and methods for providing improved heat transfer.

But for issues of thermal mismatch and materials incompatibilities, gold and gold-based alloys would be preferred components for an intermediate layer to transfer heat at the interface between a heat sink and a semiconductor die. Gold and gold-based alloys (such as combinations of gold with silicon (Si), tin (Sn), or germanium (Ge) have much greater thermal conductivities than organic materials, including the above-discussed thermal greases. According to one embodiment of the invention, a preform structure comprises gold or gold-based alloy materials. When such a preform is positioned in a multilayer metallurgical stack, interposed between the integrated circuit device and the heat sink, the resulting layer is compatible with adjoining materials and provides an efficient path to dissipate heat from integrated circuit die.

Figure 1:
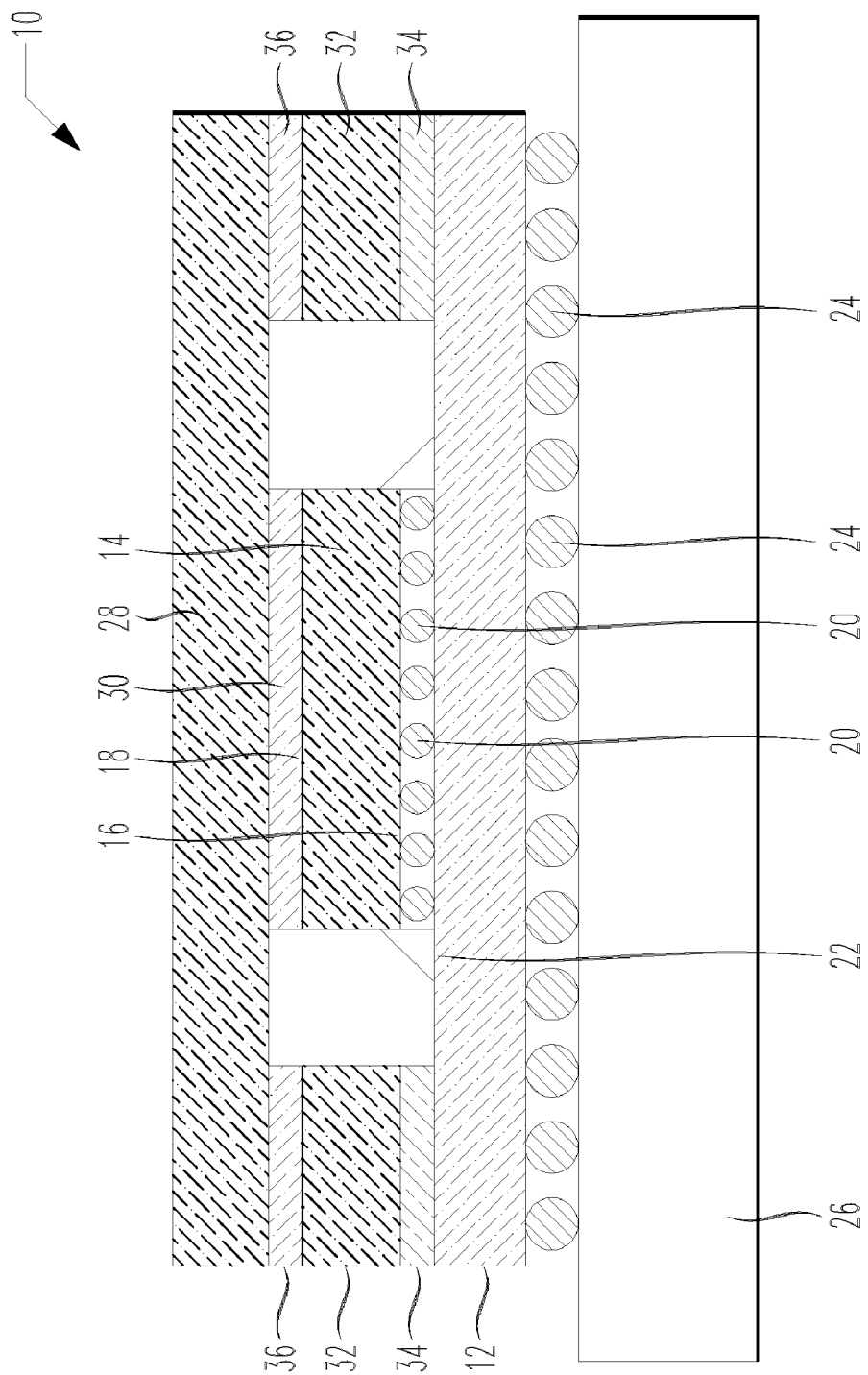
FIG. 1 shows a view in cross-section of a packaged integrated circuit device according to the invention.

With reference to FIG. 1 and to more clearly illustrate features of the invention, a partial view is shown of an integrated circuit device 10. The device 10 includes a package substrate 12 to which an integrated circuit die 14 is attached. The die 14 has an active side 16 on which circuit devices are formed and a back side 18 providing a path for heat dissipation. In some cases, direct chip attach of integrated circuit die 14 can be made to the circuit board 26, eliminating the intermediate package substrate 12. In this embodiment, the circuit board 26 can be constructed to interface with the stiffener ring.

The active side 16 of the die 14 faces, and is connected to, the package substrate 12 through a plurality of electrical contacts in the form of solder bumps 20. The solder bumps 20 may be encased in a non-conductive underfill material 22 for protection. The package substrate 12 includes a further system of interconnect (not shown), providing electrical connection from the solder bumps 20 to a matrix of solder balls 24 at the exterior of the package, termed a ball grid array. The solder balls 24 are connected to a circuit board 26 or another device to effect electrical contact with the circuitry on the die 14.

The backside surface 18 of the die 14 is in contact with a heat sink 28 through a first joint layer 30 interposed therebetween. In one embodiment, the joint layer 30 comprises gold or a gold-based alloy layer, providing a path of high thermal conductivity from the back side surface 18 of the die 14 to the heat sink 28. The joint layer 30 provides a metallurgical bond between the die surface 18 and the heat sink 28. Portions of the package system to which the heat sink 28 may be attached are not illustrated. For example, the heat sink 28 could be part of a multi-chip module package.

A rectangular-shaped stiffener ring 32 is attached along the periphery of the package substrate 12 with, for example, an adhesive layer 34 to form an integral part of the package substrate 12. The combination of the stiffener ring 32, the package substrate 12 and the heat sink 28, enclose the die 14. In the illustrated embodiment a second joint layer 36, which may also comprise gold or a gold-based alloy layer, provides a metallurgical bond between the stiffener ring 32 and the heat sink 28.

In lieu of providing a layer of thermal grease, the metallurgical bonds between the joint layer 30 and each of the die 14 and heat sink 28 effect a path of high thermal conductivity between the die 14 and the heat sink 28. A process sequence for fabricating the device 10 according to the present invention is described below with reference to FIGS. 2 through 7.

Figure 2:
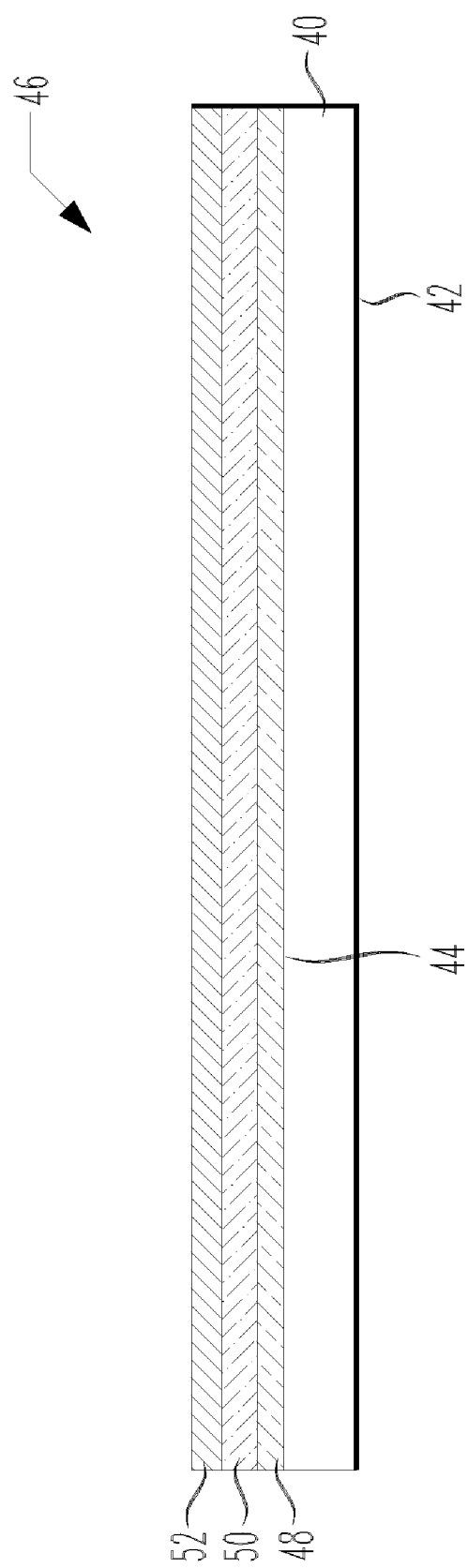
FIG. 2 is a view in cross section of a back side metal stack formed on a semiconductor wafer.

FIG. 2 illustrates a semiconductor wafer 40 at a step in the fabrication sequence after a plurality of integrated circuit devices (not shown) have been formed on a front, active side 42 thereof. The back side 44 of the wafer 40 is positioned to receive a backside metal stack 46 which may, for example, comprise an adhesion layer 48, a barrier layer 50, and a gold-containing layer 52. The adhesion layer, provided because gold does not adhere well to silicon, may comprise from 1000 angstroms to 2000 angstroms of titanium deposited with conventional plasma vapor deposition (PVD) sputtering techniques. The barrier layer 50, formed on the adhesion layer 48, e.g. by sputtering, prevents gold in the layer 52 from diffusing through the adhesion layer 48 and into the semiconductor material of the wafer 40. Preferably, the barrier layer 50 predominantly comprises platinum which provides a stable film with low corrosive and low oxidation properties. The barrier layer 50 may range in thickness from 50 to 1000 angstroms, and is preferably 1000 angstroms thick. Other materials with which the barrier layer 50 may be formed include nickel, palladium, copper, chromium and alloys thereof. The gold layer 52, formed over the barrier layer 50, assures availability of gold in the subsequent bonding process, and facilitates formation of a metallurgical bond between the joint layer 30 and each of the die 14 and heat sink 28. The gold layer 52 may range in thickness from 1000 to 15,000 Angstroms, and is preferably 2000 angstroms thick. These ranges may be exceeded based on application requirements. Layer 52 may also comprise a gold alloy such as gold-silicon, gold-tin, or gold-germanium.

Although not illustrated, a processing sequence for wafer 40 may next include conventional packaging steps using flip chip or other packaging methods. The solder bumps 20 are applied to the active side 42 of the wafer 40 using one of several well-known techniques. During formation of the solder bumps 20, a protective layer (not shown) may be applied to the backside metal stack 46 to protect it from damage and subsequently removed. The die 14 are then singulated.

Figure 3:
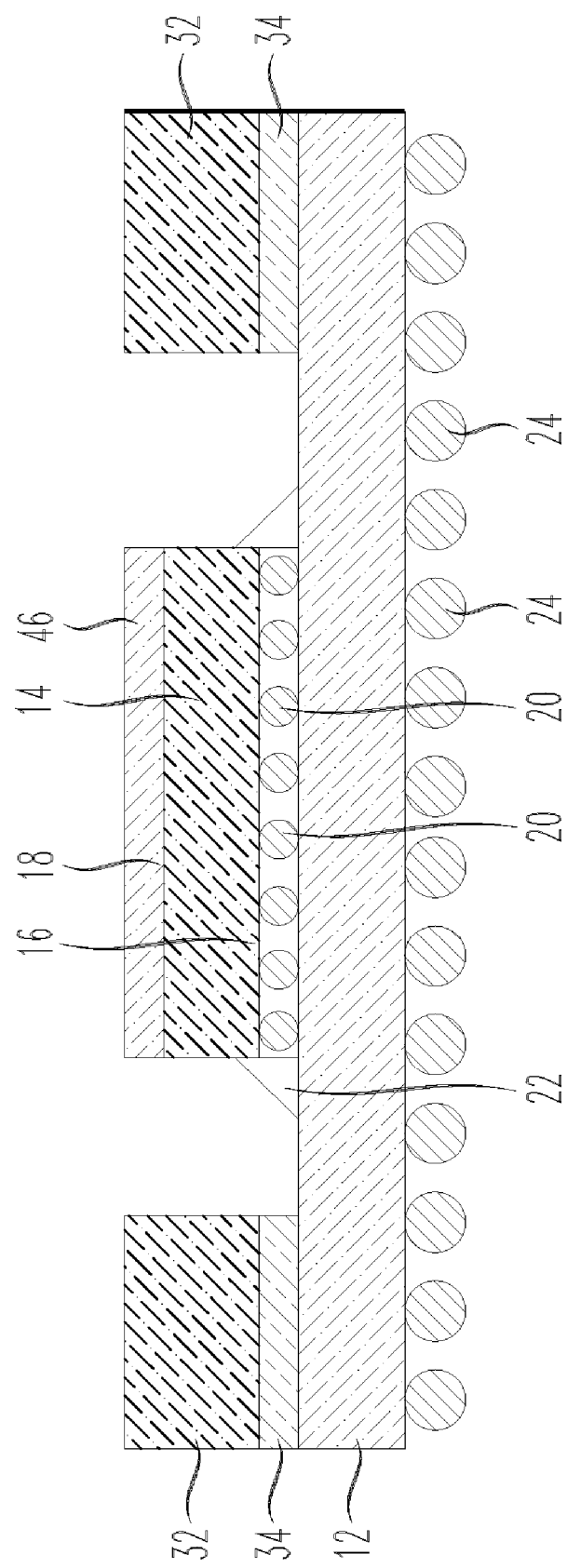
FIGS. 3, 4 and 5 show, in cross-sectional view, steps in the process of fabricating a semiconductor device according to the invention.

FIG. 3 illustrates the die 14 positioned on the package substrate 12 with the solder bumps 20 on the active die side 16 connected to landing pads (not shown) on the package substrate 12 which provide contact to the solder balls 24. The back side metal stack 46 faces away from the package substrate 12. The stiffener ring 32 is connected to the outer region of the package substrate 12 by an adhesive layer 34 forming an integral part of the package substrate 12. The underfill material 22 is applied to protect the solder bumps 20.

Figure 4:
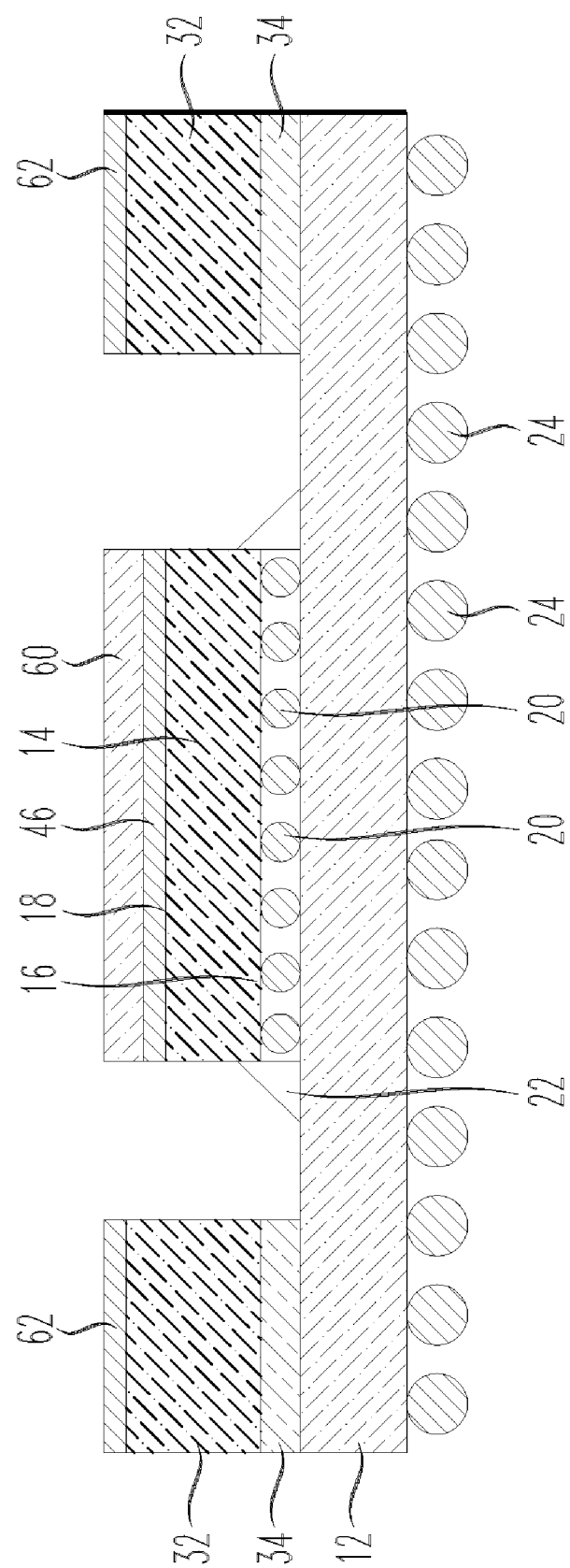

Next, FIG. 4 illustrates a circuit inner preform 60, comprising a gold alloy positioned on the back side metal stack 46 of the die 14. The circuit inner preform 60 of gold alloy material is used to metallurgically attach the back side metal stack 46 of the die 14 to the heat sink 28, thus allowing intimate contact with essentially no air voids. Simultaneous with the placement of the circuit inner preform 60, an outer preform 62 is positioned on the stiffener ring 32. Each of the preforms 60 and 62 comprises a gold alloy which is a component of the joint layers 30 and 36. By way of example, the gold alloy of the circuit inner and outer preforms 60 and 62 may comprise silicon, germanium, or tin which results in a lower eutectic bonding temperature than pure gold, although the preforms could be formed of pure gold. According to one aspect of the invention, application of heat at or above the eutectic temperature of a gold alloy present in the preforms 60 and 62 melts the preforms, and consumes gold from any adjoining metal layers such as the back side metal stack 46 as well as the metal stack 70 of the heat sink 28. Upon cooling, the solid metals combine to form a metallurgical bond between each preform and the adjoining back side metal stack 46. The composition of the gold alloy may be selected based on eutectic properties. For example, a preform 60 or 62 may comprise gold with the eutectic composition of 6 weight percent silicon. Other gold alloys may include gold with approximately 20 weight percent tin or gold with 12 weight percent germanium. The thickness of the preforms 60 and 62 may range between 0.0127 mm. to 0.0508 mm., with a preferred thickness of 0.0254 mm. Alternately, the heat sink 28 may be fitted with the preforms 60 or 62 before being attached to the die 14 and stiffener ring 32. Alternately, in lieu of using the preforms, gold or a gold alloy can be formed on the metal stack 46 with a plating process or other deposition technique. The integrated circuit die can be attached directly to the circuit board 26 with the above process being used to construct the same attachment process for direct chip attach.

Figure 5:
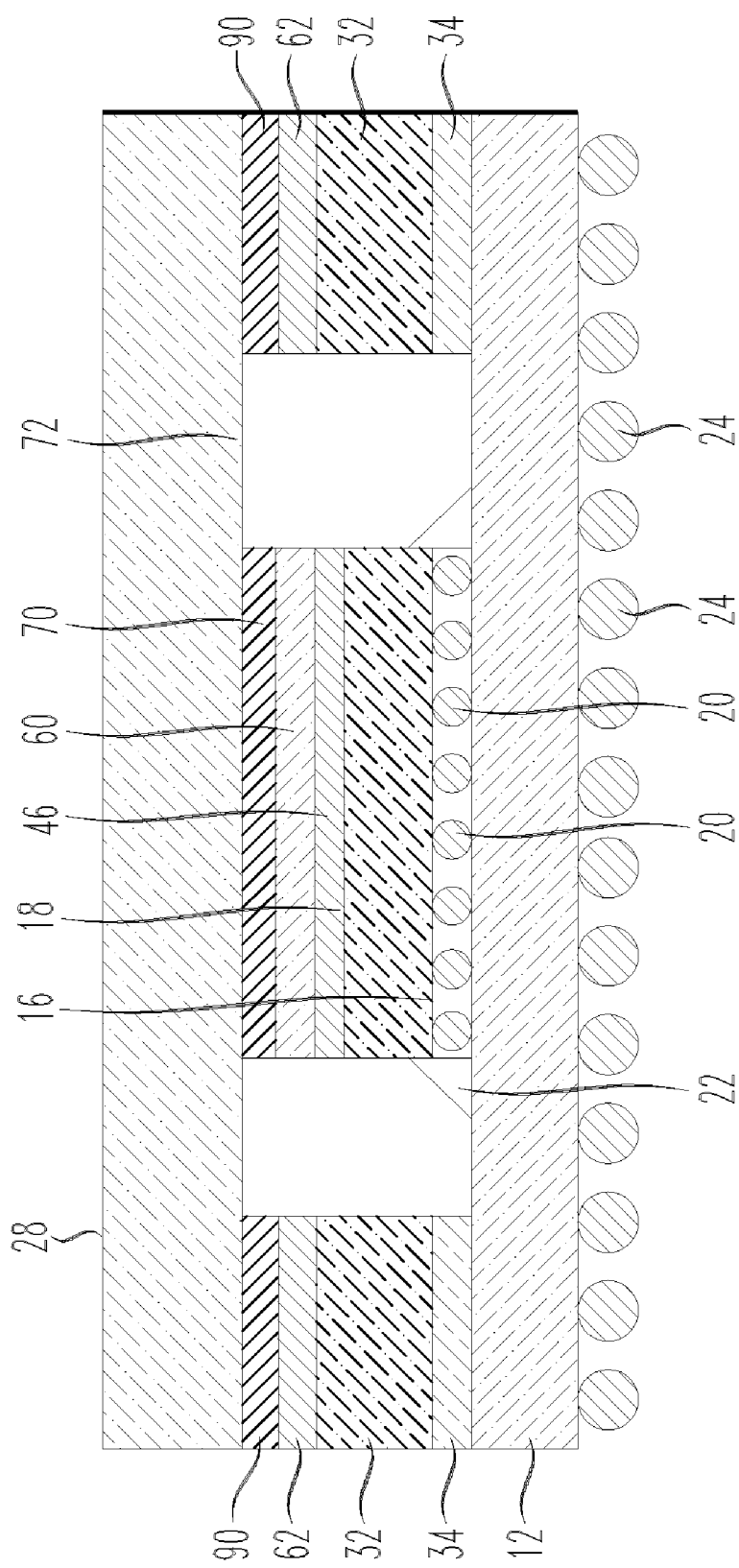
Figure 6:
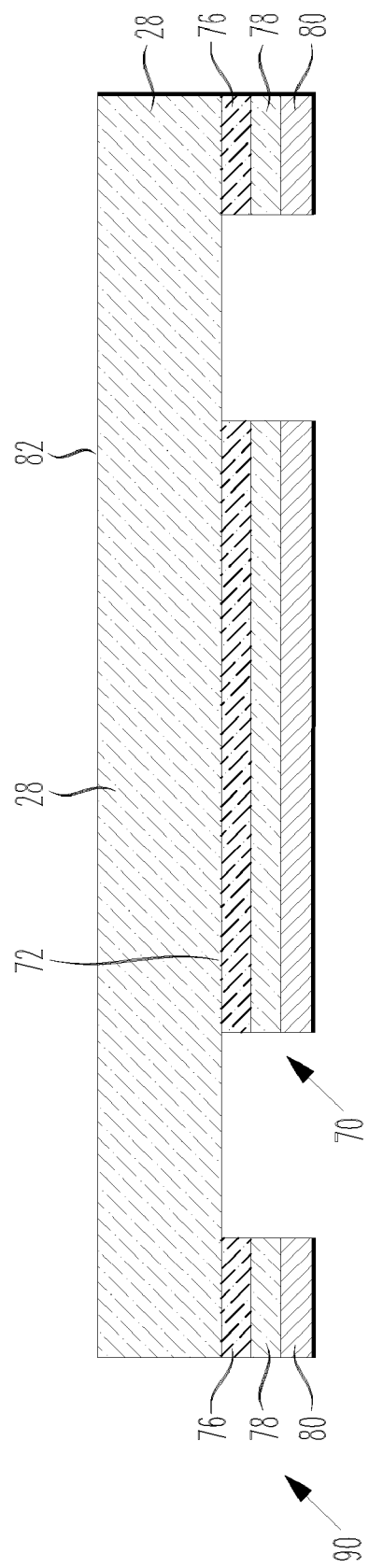
FIG. 6 is a view, in cross section, of a metallized stack formed on a heat sink according to the invention.

FIG. 5 illustrates the heat sink 28 in contact with the circuit inner and outer preforms 60 and 62 to enclose the die 14. FIG. 6 illustrates the heat sink 28 comprising metallized stacks 70 and 90, formed on the lower side 72 of the heat sink 28. Stack 70 contacts a circuit inner preform 60 and stack 90 contacts an outer preform 62. The heat sink 28 may comprise a substrate of copper, nickel or Alloy 42 material. The stacks 70 and 90 may be identically formed of an adhesion layer 76, a barrier layer 78 and a gold alloy layer 80. The adhesion layer 76 may be a layer of titanium on the order of 50 to 2000 Angstroms thick. The barrier layer 78 may be a layer of nickel, on the order of 50 to 2000 Angstroms thick. Other noble transition metals, such as platinum or palladium, may also be used for layer 78. The gold alloy layer 80 is deposited over the barrier layer 78 and is on the order of 1000 to 2000 Angstroms thick. Each of the layers 76, 78, and 80 may be deposited using conventional methods as part of the heat sink fabrication process.

An exemplary heating process to effect bonds between the heat sink 28 and the die 14 includes two heating elements, each having a pattern corresponding to a different one of the preforms 60 and 62. The elements may be applied against the back side 82 of the heat sink 28 to reach the necessary temperature to form the joint layers 30 and 36. During the heating process, gold and other material in layer 52 of the back side metal stack 46, in the circuit inner preform 60, and in the layer 80 of the metal stack 70 of the heat sink 28, reach a melting temperature and become reflowable. When cooled the materials form the joint layer 30 which provides a metallurgical bond between the back side 18 of the die 14 and the interior surface 72 of the heat sink 28, creating an effective heat transfer path from the die 14 to the heat sink 28. In the heating process the outer preform 62 melts and, when cooled, forms the joint layer 36, providing a metallurgical bond between the stiffener ring 32 and the surface 72 of the heat sink 28.

The elevated temperature during the heating process is dependant on the composition of the gold alloy preforms 60 and 62. For a gold-tin alloy comprising approximately 20 weight percent tin, the process of forming a metallic bond may apply a heating temperature above the eutectic temperature of 280 Celsius (C), and will preferably apply a temperature in the range of 300 to 325 C. A gold-germanium alloy comprising 12 weight percent of germanium may preferably use a heating temperature of 356 degrees C. or higher. The composition of a gold alloy used in layer 80 of each metal stack 74 and 90 of the heat sink 28 should be consistent with the composition of the preforms 60 and 62.

Figure 7:
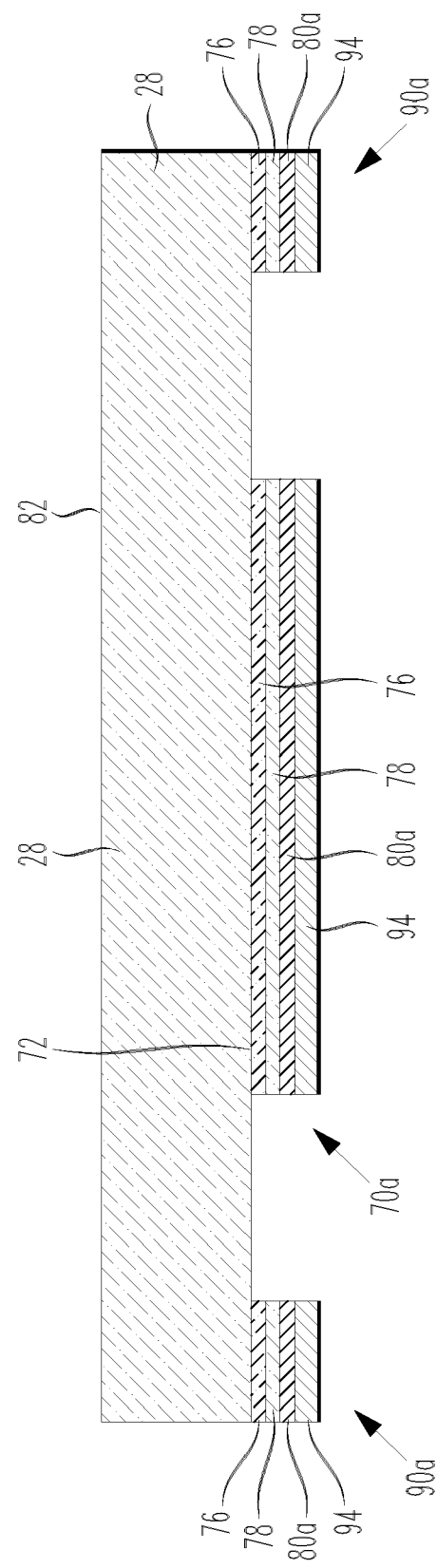
FIG. 7 shows a metallized stack formed on a heat sink according to an alternate embodiment of the invention.

FIG. 7 illustrates, according to an alternate embodiment of the invention, a gold alloy layer 94 forming part of metallized stacks 70a and 90a of the heat sink 28. In this example, layer 80a is optional but, when included, may be on the order of 500 to 1000 Angstroms thick, serving as a seed layer for depositing layer 94 with a plating process. The layer 94 may be a gold alloy on the order of 1000 to 15,000 Angstroms thick, formed by electroless plating or electroplating. The layer 94 may be an alloy of gold and one of silicon, tin or germanium.

Figure 8:
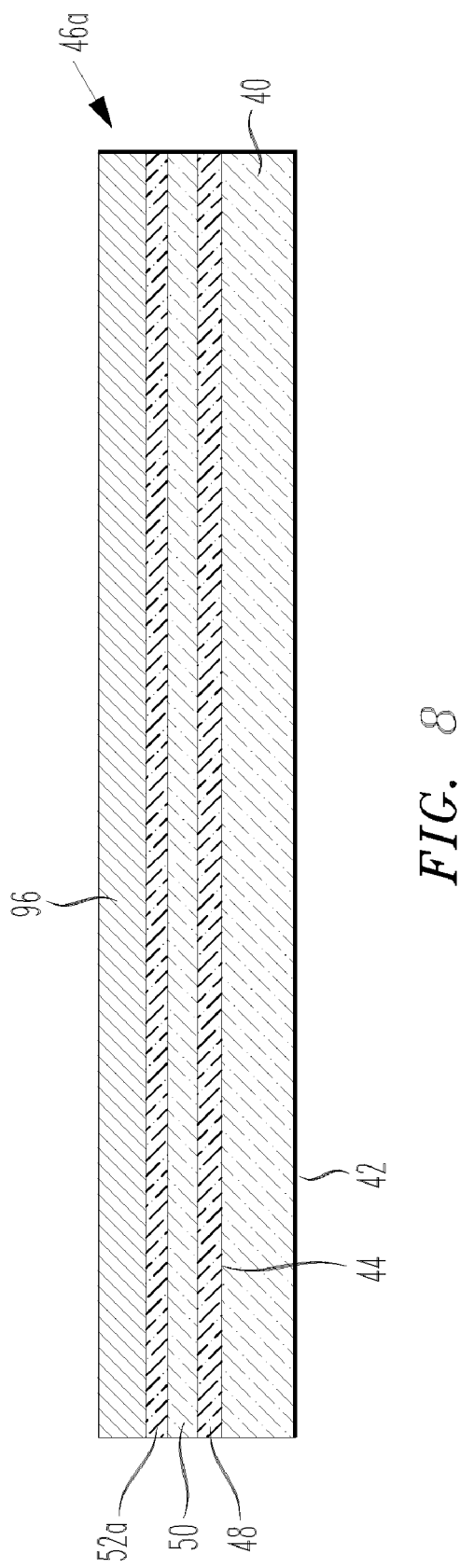
FIG. 8 is a view in cross section of an alternate embodiment of a back side metal stack formed on a semiconductor wafer in the fabrication sequence at a step after the devices have been formed on the front side of the wafer.

In another embodiment, illustrated in FIG. 8, the backside metal stack 46a may be formed of a thick gold alloy layer 96 which may be deposited with a plating process. In this example, layer 52a is optional but when included, may be a thin layer of gold, on the order of 500 to 1000 Angstroms thick, serving as a seed layer for the plating process. The layer 96 is a gold alloy, 2 to 10 microns thick also formed with an electroplating or electroless plating process. The layer 96 may be an alloy of gold and one of silicon, tin or germanium. The outer preform 62 is optional to the fabrication process for this embodiment.

According to another embodiment of the invention, during the heating process silicon from the back side 18 of die 14 migrates through the barrier layer 50 into the circuit inner preform 60. The diffusion of silicon from the back side 18 of the die 14 into the gold alloy from the circuit inner preform 60 creates conditions wherein a lower eutectic melting point is achieved. The gold layer 52, 52a of the back side metal stack 46, 46a is consumed into the melting process of the gold alloy of the circuit inner preform 60 and pulled into the region forming the circuit heat transfer joint 30. The melted materials cool to form the joint layer 30 which comprises a combination of gold, silicon and one other element (e.g., tin or germanium) when these elements are included in the gold alloy of the circuit inner preform 60. A mechanical attachment process, without heat, may also be used to attach the heat sink 28 to the circuit inner and outer preforms 60 and 62.

Although not illustrated, the fabrication sequence includes additional steps conventional to flip chip fabrication, e.g., forming solder balls 24, and further assembly of the packaged device 10 with circuit board 26 or another structure.

A semiconductor device with improved heat transfer capabilities has been described. The disclosed embodiments provide a basis for practicing the invention while numerous variations will be apparent. For example, while gold has been disclosed as a material for many of the structures described herein, other thermally conductive materials may be found suitable as well. More generally, features and elements associated with illustrated embodiments are not to be construed as required elements for all embodiments and the invention is limited only by the claims which follow.

What is claimed is:

1. A method of manufacturing a flip chip integrated circuit device comprising:
positioning an integrated circuit die over an upper surface of a package substrate that includes an inner region and a peripheral region, the die including a first surface in contact with the package substrate and a second opposing surface having a metallic layer formed thereon;
placing a stiffener ring with upper and lower surfaces about the die, including attaching the lower surface to a peripheral region of the package substrate;
forming a first metallic preform on the metallic layer;
forming a second metallic preform on the upper surface of the stiffener ring;
positioning a heat sink over the first and second preforms; and
metallurgically bonding the heat sink to the integrated circuit die.

2. The method of claim 1 further including forming a metallic joint layer on the first and second metallic performs and the metallic layer and metallurgically bonding the heat sink to the metallic joint layer.

3. The method of claim 2, wherein forming the metallic joint layer includes forming a gold-containing layer that contacts the first and second metallic performs and the metallic layer, forming an adhesion layer that contacts the heat sink, and forming a barrier layer located between the gold-containing layer and the adhesion layer.

4. The method of claim 2 wherein the second surface of the integrated circuit die comprises silicon and forming the joint layer includes migration of silicon from the second surface of the integrated circuit die into the first preform, thereby lowering the temperature at which the first preform melts.

5. The method of claim 2 wherein the second surface of the integrated circuit die comprises silicon and forming the joint layer includes migration of silicon from the second surface of the integrated circuit die into the preform such that the heat transfer joint comprises silicon.

6. The method of claim 1, wherein the metallic layer includes an adhesion layer located on the die, a barrier layer located on the adhesion layer, and a gold-containing layer located on the barrier layer.

7. The method of claim 6, wherein the gold-containing layer of the metallic layer contacts the first and second metallic performs.

8. The method of claim 7, wherein forming the first and second metallic performs includes forming a gold-containing layer on the gold-containing layer of the metallic layer.

9. The method of claim 8, wherein the adhesion layer comprises titanium and the barrier layer comprises platinum.

10. The method of claim 1, wherein attaching the lower surface of the stiffener ring to a peripheral region of the package substrate includes using an adhesive.

* * * * *